(12) United States Patent
Matsumoto

(10) Patent No.: US 8,525,332 B2
(45) Date of Patent: Sep. 3, 2013

(54) SEMICONDUCTOR DEVICE HAVING SEMICONDUCTOR SUBSTRATE, AND METHOD OF MANUFACTURING THE SAME

(75) Inventor: Takeshi Matsumoto, Hyogo (JP)

(73) Assignee: Panasonic Corporation, Osaka (JP)

(*) Notice: Subject to any disclaimer, the term of this patent is extended or adjusted under 35 U.S.C. 154(b) by 73 days.

(21) Appl. No.: 13/230,395

(22) Filed: Sep. 12, 2011

(65) Prior Publication Data

US 2011/0316154 A1 Dec. 29, 2011

Related U.S. Application Data

(63) Continuation of application No. PCT/JP2010/001137, filed on Feb. 22, 2010.

(30) Foreign Application Priority Data

Mar. 19, 2009 (JP) .................................. 2009-069015

(51) Int. Cl.
*H01L 23/48* (2006.01)
*H01L 21/44* (2006.01)

(52) U.S. Cl.
USPC ............... 257/737; 257/738; 257/E23.021; 257/E23.068; 438/612; 438/613

(58) Field of Classification Search
USPC .......... 257/737, 738, 786, E23.021, 780–782, 257/E23.068; 228/180.22; 438/612–617; 439/66
See application file for complete search history.

(56) References Cited

U.S. PATENT DOCUMENTS

| 6,353,266 | B1 | 3/2002 | Okamura | |
|---|---|---|---|---|
| 6,387,734 | B1* | 5/2002 | Inaba et al. | 438/125 |
| 6,400,021 | B1* | 6/2002 | Cho | 257/738 |
| 6,472,763 | B2* | 10/2002 | Fukuda et al. | 257/780 |
| 2001/0015285 | A1 | 8/2001 | Nakayama | |
| 2009/0256257 | A1* | 10/2009 | Daubenspeck et al. | 257/738 |

FOREIGN PATENT DOCUMENTS

| JP | 05-013418 | 1/1993 |
|---|---|---|
| JP | 05-013418 A | 1/1993 |
| JP | 2000-332016 | 11/2000 |
| JP | 2001-230339 | 8/2001 |
| JP | 2002-110723 | 4/2002 |
| JP | 2004-207293 | 7/2004 |

* cited by examiner

*Primary Examiner* — Jasmine Clark
(74) *Attorney, Agent, or Firm* — McDermott Will & Emery LLP

(57) ABSTRACT

A semiconductor device includes a semiconductor substrate having a plurality of electrode pads, a protective film covering the upper surface of the semiconductor substrate and having an opening so that the electrode pad is exposed therethrough, a metal film formed on the electrode pad exposed through the opening, and a bump formed on the metal film. The metal film includes a plurality of grooves radially formed from the center thereof toward the periphery thereof.

17 Claims, 13 Drawing Sheets

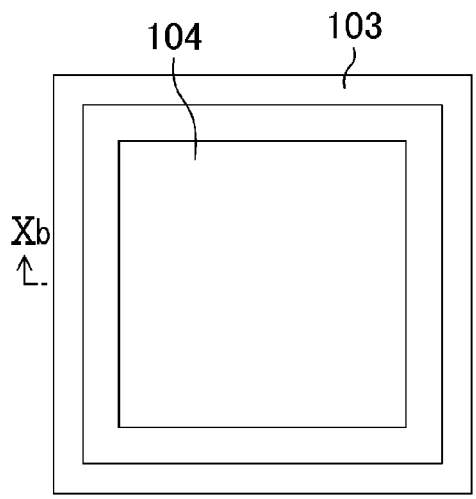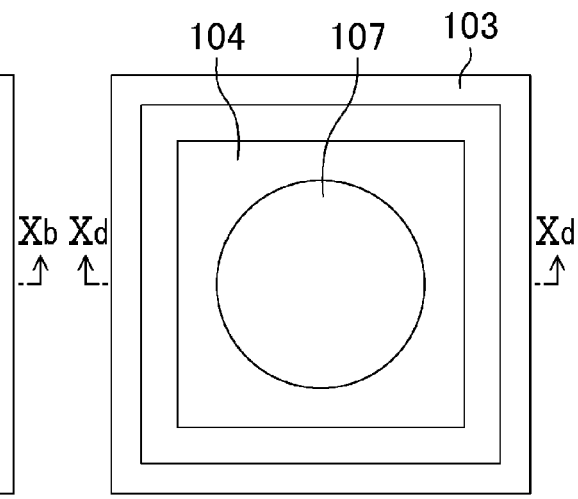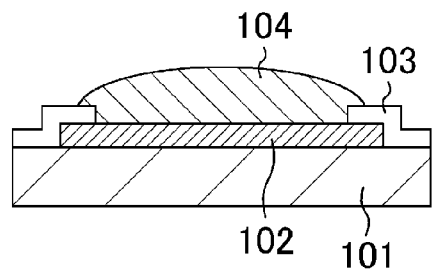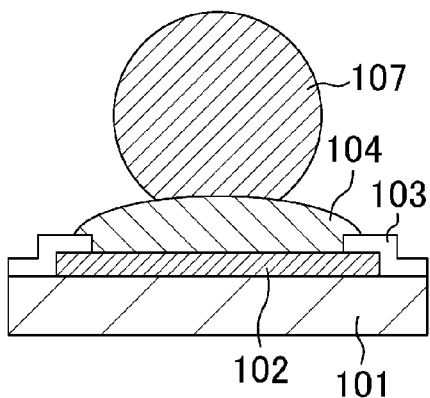
FIG.10A PRIOR ART
FIG.10C PRIOR ART
FIG.10B PRIOR ART
FIG.10D PRIOR ART

SEMICONDUCTOR DEVICE HAVING SEMICONDUCTOR SUBSTRATE, AND METHOD OF MANUFACTURING THE SAME

CROSS-REFERENCE TO RELATED APPLICATION

This is a continuation of PCT International Application PCT/JP2010/001137 filed on Feb. 22, 2010, which claims priority to Japanese Patent Application No. 2009-069015 filed on Mar. 19, 2009. The disclosures of these applications including the specifications, the drawings, and the claims are hereby incorporated by reference in their entirety.

BACKGROUND

The present disclosure relates to semiconductor devices in which bumps are formed on electrode portions by ball mounting methods, and which has a semiconductor substrate, and methods of manufacturing such semiconductor devices, and more particularly to semiconductor devices capable of positioning a ball near the center of an electrode portion by a reflow process and having reliable connection, and methods of manufacturing such semiconductor devices.

In recent years, there has been a need to package semiconductor components with high density, such as a resin sealing type semiconductor device, in order to deal with miniaturization of electronic devices, and to meet this need, semiconductor components have been miniaturized. In order to achieve the miniaturization, arrangement of bumps at a finer pitch have been developed, and there has been a demand for having a structure of electrode portions on which bumps are precisely formed at the centers of the electrode portions so that the bumps do not contact one another, and having semiconductor devices having such a structure.

A conventional semiconductor device in which a bump is formed on an electrode portion will be described hereinafter.

FIGS. 10A-10D shows a structure of the electrode portion in the conventional semiconductor device in detail.

FIG. 10A shows a plan view of the electrode portion, and FIG. 10B shows a cross-sectional view taken along cross sectional line Xb in FIG. 10A. An electrode pad 102 is formed on a semiconductor substrate 101 in which a semiconductor circuit is formed. A protective film 103 is formed so as to cover the semiconductor substrate 101, and has an opening through which the electrode pad 102 is exposed. A metal film 104 is formed as a barrier metal on the electrode pad 102. The metal film 104 is generally made of Ni and/or Au. The metal film 104 is formed to have a thickness equal to or larger than the thickness of protective film 103. For example, if the thickness of the protective film 103 is about 1 μm, the thickness of the metal film 104 is about 2 to 3 μm.

FIG. 10C shows a plan view of the electrode portion after a bump is formed, and FIG. 10D shows a cross-sectional view taken along cross sectional line Xd in FIG. 10C. Next, a method of the conventional semiconductor device will be described.

FIGS. 11A-11E and FIGS. 12A-12D show the method of the conventional semiconductor device in detail.

First, as shown in FIG. 11A, the electrode pad 102 is formed on the semiconductor substrate 101 in which the semiconductor circuit is formed. Then, as shown in FIG. 11B, the protective film 103 is formed so as to cover the semiconductor substrate 101, and as shown in FIG. 11C, an etching process and etc. is performed with respect to the protective film 103, thereby forming the opening so that the electrode pad 102 is exposed therethrough. Then, as shown in FIG. 11D, the metal film 104 is formed as a barrier metal on the electrode pad 102. An electroless plating method is generally used for forming the metal film 104, and the metal film 104 is made of Ni and/or Au. The metal film 104 is formed to have a thickness equal to or larger than the thickness of protective film 103. For example, if the thickness of the protective film 103 is about 1 μm, the thickness of the metal film 104 is about 2 to 3 μm. Next, as shown in FIG. 11E, a flux 105 is formed on the metal film 104. The flux 105 is formed because there is an advantage that the flux 105 serves as an adhesive for bonding the metal film 104 to the solder ball 106, and in addition, there is also an advantage that the flux 105 can remove an oxide film formed on the surface of the solder ball 106. Then, as shown in FIG. 12A, the solder ball 106 is mounted on the flux 105. FIG. 12B is a plan view of the electrode portion on which the solder ball is mounted (FIG. 12A is a cross-sectional view taken along cross sectional line XIIa in FIG. 12B). Finally, as shown in FIG. 12C, a reflow process is performed by a heat treatment, thereby centering the solder ball 106, the shape of the solder ball 106 is adjusted, and the flux 105 is removed by cleaning or the like to form a bump 107. FIG. 12D is a plan view of the electrode portion after the reflow process (FIG. 12C is a cross-sectional view taken along cross sectional line XIIc in FIG. 12D).

SUMMARY

However, the conventional semiconductor device and the method of manufacturing the conventional semiconductor device have the following problems.

FIGS. 13A-13B show one example when the solder ball 106 is mounted on the metal film 104. As shown in these figures, the flux 105 is formed on the metal film 104, and then, the solder ball 106 is mounted on the flux 105. However, due to a problem of mounting precision, the solder ball 106 may be displaced from the center of the metal film 104, as shown in these figures. In this case, the solder ball 106 is reflowed by a heat treatment, and therefore, the solder ball 106 whose surface has been melted is moved to the center of the metal film 104 to settle into a more stable state, which is a generally known phenomenon. However, as shown in FIGS. 13A-13B, if the solder ball 106 is mounted to be far displaced, the solder ball 106 is not centered well, and a bump is formed in the periphery of the metal film 104. This may cause a contact between bumps, and a bonding failure between the bump and an electrode in a package substrate in a subsequent step of assembling a package, resulting in a deterioration of reliable connection.

It is an object of the present invention to provide a semiconductor device and a method of manufacturing the semiconductor device in which, even when the solder ball 106 is mounted to be far displaced from the center of the metal film 104, the solder ball 106 is likely to be positioned near the center of the metal film 104 if the solder ball 106 is reflowed by a heat treatment.

Japanese Patent Publication No. 2002-110723 discloses an invention having an object of preventing a solder ball from being displaced when the solder ball is mounted on an electrode.

In order to attain the above object, a first semiconductor device according to the present invention includes: a semiconductor substrate having a plurality of electrode pads; a first protective film covering an upper surface of the semiconductor substrate and having an opening so that the electrode pad is exposed therethrough; a metal film formed on the electrode pad exposed through the opening; and a bump formed on the metal film, wherein the metal film includes a plurality of grooves radially formed from the center thereof toward the periphery thereof.

In the first semiconductor device according to the present invention, the groove of the metal film is formed to be narrower at a periphery of the metal film than at the center of the metal film.

A second semiconductor device according to the present invention includes: a semiconductor substrate having a plurality of electrode pads; a first protective film covering an upper surface of the semiconductor substrate and having an opening so that the electrode pad is exposed therethrough; a second protective film formed on the electrode pad exposed through the opening; a metal film formed on the opening; and a bump formed on the metal film, wherein the second protective film includes a plurality of branches radially formed from the center of the electrode pad toward a periphery of the electrode pad, the metal film includes a plurality of grooves radially formed from the center thereof toward a periphery thereof, and the grooves of the metal film are formed along shapes of the branches of the second protective film.

In the second semiconductor device according to the present invention, the branch of the second protective film is formed so that the branch is narrower at a periphery of the opening of the electrode pad than at the center of the opening of the electrode pad.

In the second semiconductor device according to the present invention, the first protective film and the second protective film are connected to each other at the end of the opening.

In the first semiconductor device or the second semiconductor device according to the present invention, part of the metal film partitioned by adjoining two of the grooves is curved in the thickness direction thereof.

On a semiconductor substrate according to the present invention, a plurality of electrode pads, a protective film having an opening so that the electrode pad is exposed therethrough, and a metal film formed on the electrode pad exposed through the opening are formed, wherein the metal film includes a plurality of grooves radially formed from the center thereof toward a periphery thereof.

A first method of manufacturing a semiconductor device including a semiconductor substrate having a plurality of electrode pads according to the present invention includes: forming a protective film to cover an upper surface of the semiconductor substrate; forming an opening so that the electrode pad is exposed therethrough; forming a metal film on the electrode pad exposed through the opening; radially forming grooves from the center of the metal film toward a periphery of the metal film; and forming a bump on the metal film.

In the first method of manufacturing the semiconductor device according to the present invention, the groove of the metal film is formed to be narrower at a periphery of the metal film than at the center of the metal film.

In the first method of manufacturing the semiconductor device according to the present invention, the metal film is formed by an electroless plating method.

A second method of manufacturing a semiconductor device including a semiconductor substrate having a plurality of electrode pads according to the present invention includes: forming a first protective film to cover an upper surface of the semiconductor substrate; forming an opening so that the electrode pad are exposed therethrough; forming, in the opening, a second protective film having a plurality of branches radially formed from the center of the electrode pad toward a periphery of the electrode pad; forming a metal film on the electrode pad exposed through the opening by an electroless plating method, the metal film including a plurality of grooves radially extending from the center of the metal film toward a periphery of the metal film along the shape of the branch of the second protective film; and forming a bump on the metal film.

In the second method of manufacturing the semiconductor device according to the present invention, the branch of the second protective film is narrower at the periphery of the opening of the electrode pad than at the center of the opening of the electrode pad.

In the second method of manufacturing the semiconductor device according to the present invention, the first protective film and the second protective film are connected to each other at the end of the opening.

In the second method of manufacturing the semiconductor device according to the present invention, the first protective film and the second protective film are formed in the same process step.

In the first method of manufacturing the semiconductor device or the second method of manufacturing the semiconductor device according to the present invention, part of the metal film partitioned by adjoining two of the grooves is curved in the thickness direction thereof.

With the above semiconductor devices, even if a solder ball is mounted to be far displaced from the center of a metal film, the solder ball can be positioned near the center of the metal film by grooves of the metal film serving as a guide for forming the solder ball on the metal film when the solder ball is reflowed by a heat treatment. There is also an advantage that, after the positioning, the stress applied to a bump is distributed by ball holding portions in packaging steps.

With the above methods of manufacturing the semiconductor devices, it is possible to manufacture semiconductor devices on which balls are mounted with high yield. In addition, positional precision of the bump or compression resistance of the bump is improved, thereby making it possible to prevent decrease of connection reliability in a subsequent step of assembling a package, and improve yield.

BRIEF DESCRIPTION OF THE DRAWINGS

FIGS. 10A and 10C are plan views showing a conventional semiconductor device and FIGS. 10B and 10D are cross-sectional views showing the conventional semiconductor device.

DETAILED DESCRIPTION

Semiconductor devices and methods of manufacturing the same according to embodiments of the present invention will be described with reference to the drawings.

First Embodiment

Figure 1A:
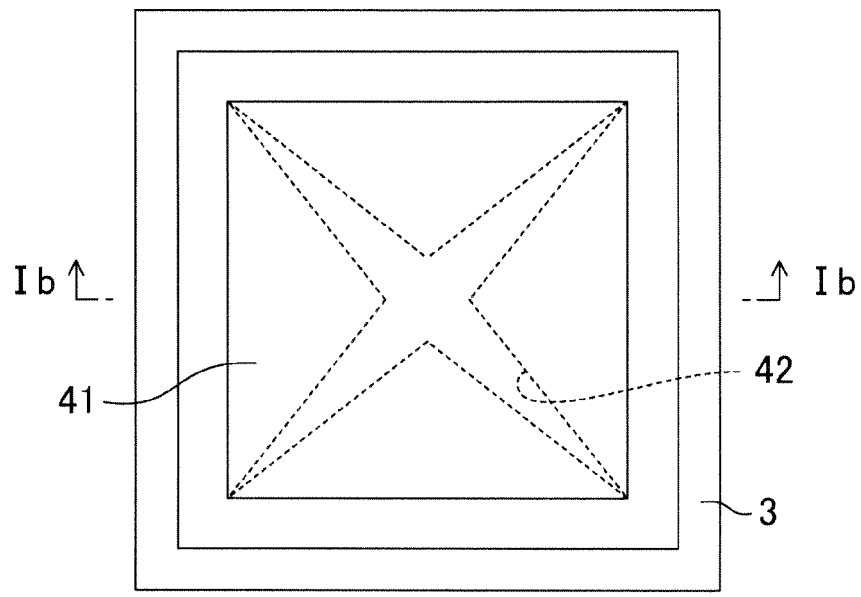
FIGS. 1A, 1C, and 1D are plan views
Figure 1B:
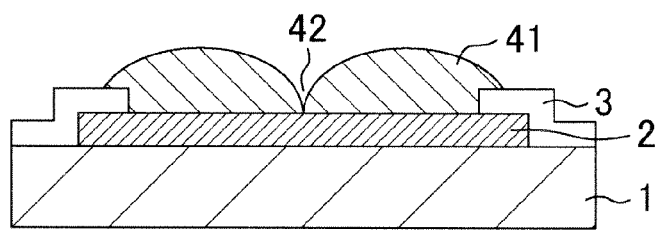
FIG. 1B is a cross-sectional view showing a semiconductor device in a first embodiment of the present invention.
Figure 1C:
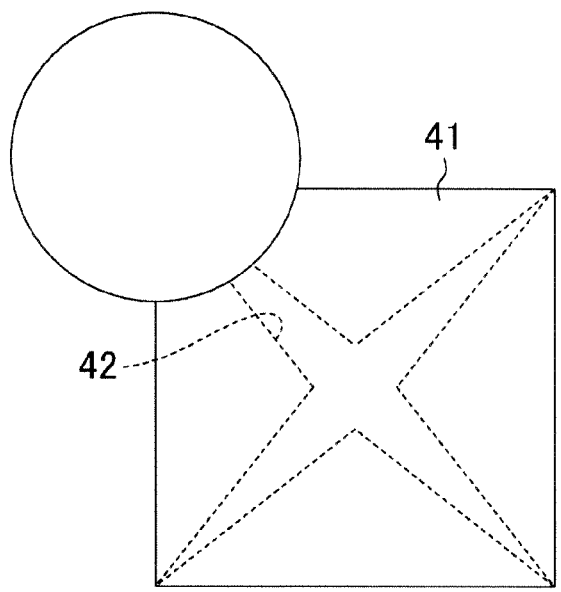
Figure 1D:
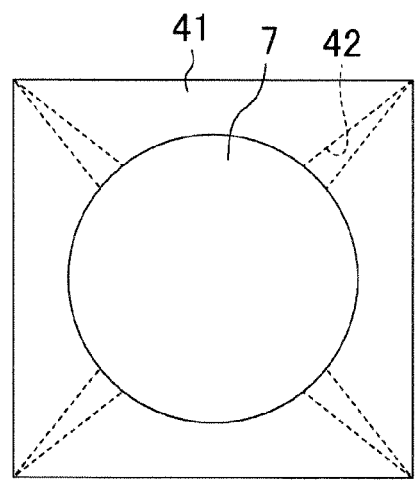

FIGS. 1A-1D are views showing a semiconductor device in this embodiment. FIG. 1A shows a plan view of a metal film, FIG. 1B shows a cross-sectional view taken along cross sectional line Ib in FIG. 1A. FIG. 1C shows a plan view of a metal film mounting a solder ball thereon, and FIG. 1D shows a plan view after a reflow process.

As shown in FIGS. 1A-1D, the semiconductor device in this embodiment focuses on a semiconductor device in which an electrode portion is formed by a ball mounting method, where a plurality of grooves are provided in a metal film so as to be radially arranged from the center of the metal film toward a periphery of the metal film, thereby reliably positioning a solder ball at the center of the metal film during a reflow process. The semiconductor device has a structure in which an electrode pad 2 is formed on a semiconductor substrate 1 in which a semiconductor circuit is formed, and the upper surface of the semiconductor substrate 1 is covered by a protective film 3, an opening is provided by an etching process so that the electrode pad 2 is exposed through the opening. The opening may has a circular shape or a polygonal shape other than a rectangular shape. A metal film 41 is formed as a barrier metal on the electrode pad 2. The metal film 41 is generally made of Ni and/or Au. The metal film 41 is formed to have a thickness equal to or larger than the thickness of protective film 3. For example, if the thickness of the protective film 3 is about 1 μm, the thickness of the metal film 41 is about 2 to 3 μm. As shown in FIG. 1A, the metal film 41 includes a plurality of grooves 42 radially arranged from the center thereof toward a periphery thereof. The grooves 42 of the metal film 41 may be formed so that the groove is narrower at the periphery of the metal film 41 than at the center of the metal film 41. Part of the metal film partitioned by adjoining two of the grooves may be curved in the thickness direction thereof. Besides, a bump 7 is formed on the metal film 41 as shown in FIG. 1D.

Next, a method of manufacturing the semiconductor device in this embodiment will be described.

Figure 2A:
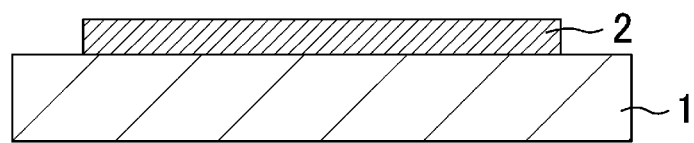
FIGS. 2A-2E are views showing a method of manufacturing the semiconductor device in the first embodiment of the present invention.
Figure 2B:
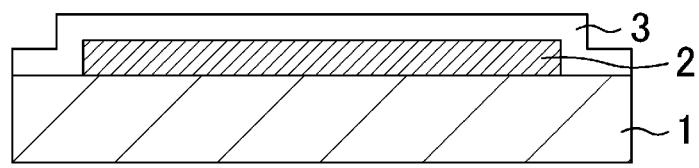
Figure 2C:
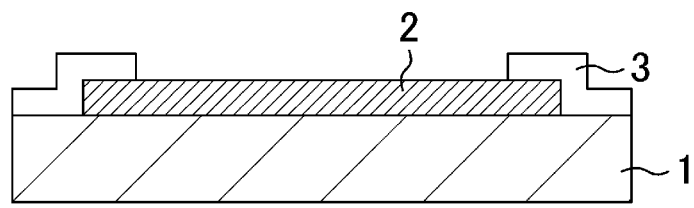
Figure 2D:
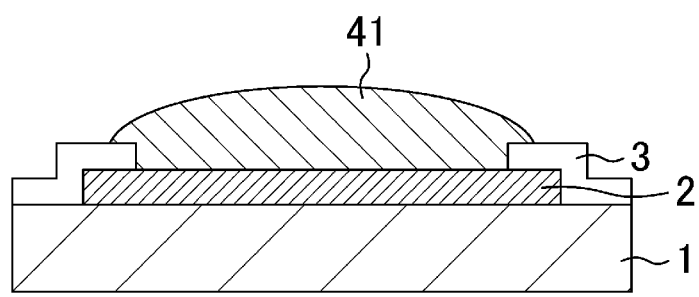
Figure 2E:
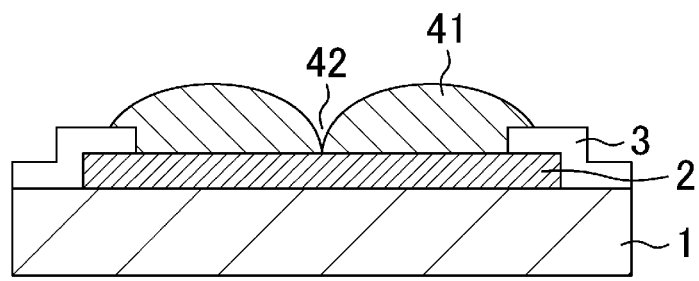
Figure 3A:
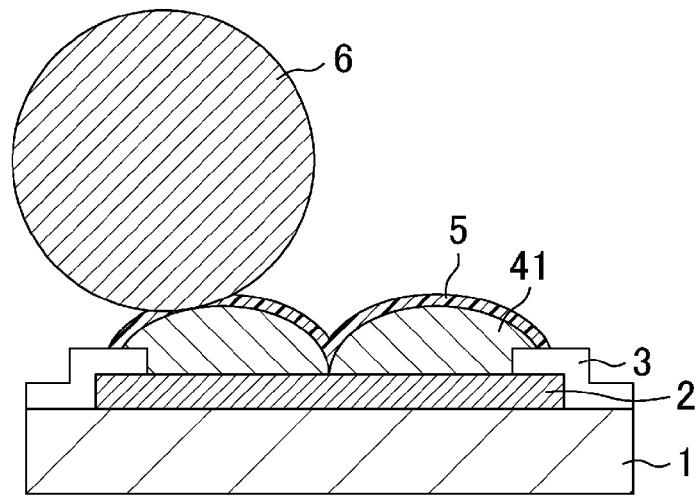
FIGS. 3A-3B are views showing the method of manufacturing the semiconductor device in the first embodiment of the present invention.
Figure 3B:
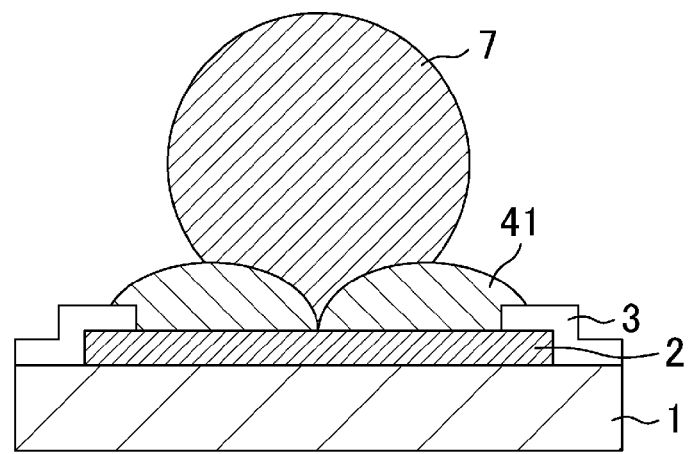

FIGS. 2A-2E and FIGS. 3A-3B are views showing a method of manufacturing the semiconductor device in this embodiment. FIG. 2A is a view showing a semiconductor substrate having the electrode pad, FIG. 2B is a view showing a step of forming the protective film on the upper surface of the semiconductor substrate, FIG. 2C is a view showing a step of forming the opening on the electrode pad, FIG. 2D is a view showing a step of forming the metal film, FIG. 2E is a view showing a step of forming the grooves, and FIGS. 3A and 3B are views showing a step of forming the bump.

First, as shown in FIG. 2B, the electrode pad 2 is generally mounted on the semiconductor substrate 1 in which the semiconductor circuit is formed. Next, the upper surface of the semiconductor substrate 1 is covered by the protective film 3.

Next, as shown in FIG. 2C, an etching process is performed with respect to the protective film 3 formed on the upper surface of the semiconductor substrate 1 to provide the opening so that the electrode pad 102 is exposed therethrough.

Next, as shown in FIG. 2D, the metal film 41 is formed as a barrier metal on the electrode pad 2. The metal film 41 is generally made of Ni and/or Au. The metal film 41 is formed to have a thickness equal to or larger than the thickness of protective film 3. For example, if the thickness of the protective film 3 is about 1 μm, the thickness of the metal film 41 is about 2 to 3 μm. The metal film 41 may be formed by using an electroless plating method.

Next, as shown in FIG. 2E, the plurality of grooves 42 are formed in the metal film 41 so as to be radially arranged from the center of the metal film 41 toward the periphery of the metal film 41. The grooves 42 in the metal film 41 may be formed so that the groove 42 is narrower at the periphery of the metal film 41 than at the center of the metal film 41. At this time, the grooves 42 are formed by grinding by a grinding machine or pressing by a pressing tool whose tip is radially formed. Part of the metal film partitioned by adjoining two of the grooves may be curved in the thickness direction thereof. At this time, for example, grinding is performed by a grinding machine, whereby the part partitioned by the two grooves is processed to have the curved shape.

Finally, as shown in FIG. 3A, a solder ball 6 is mounted on the metal film 41. At this time, a flux 5 is generally coated on the metal film 41 before the solder ball 6 is mounted. The flux 5 is formed because there is an advantage that the flux 5 serves as an adhesive for bonding the metal film 41 to the solder ball 6. In addition, there is also an advantage that the flux 5 can remove an oxide film formed on the surface of the solder ball 6. In this case, the solder ball 6 is mounted on the flux 5. Then, as shown in FIG. 3B, a heat treatment is performed to reflow the solder ball 6, thereby adjusting the shape of the solder ball 6, and centering the solder ball 106 so that the solder ball 6 can be positioned at the center of the metal film 41. Then, the flux 5 is removed by cleaning or the like to finish the formation of the bump 7.

Figure 4A:
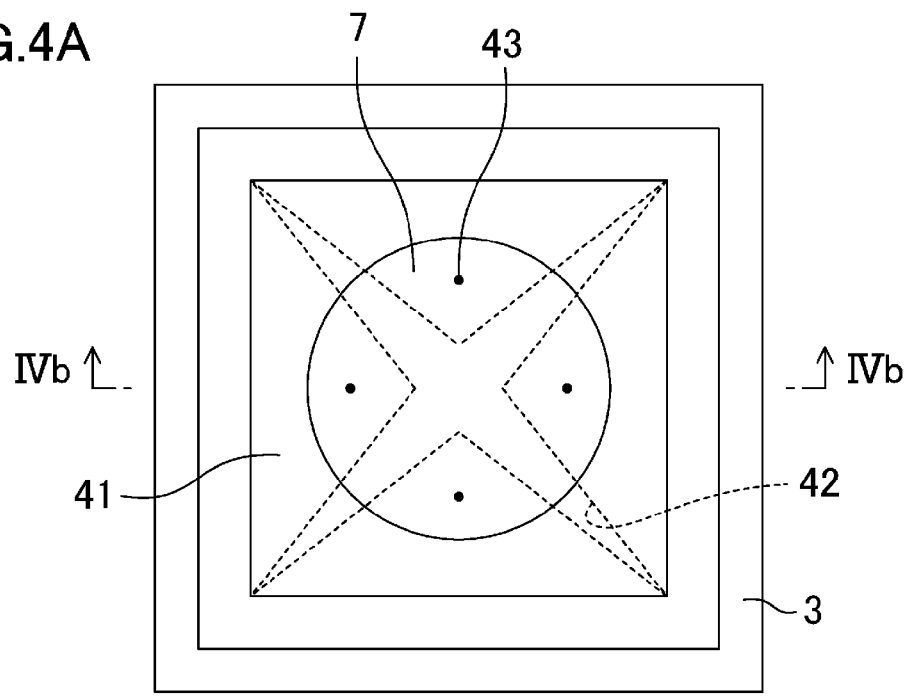
FIGS. 4A-4B are a plan view and a cross-sectional view showing the semiconductor device in the first embodiment of the present invention, respectively.
Figure 4B:
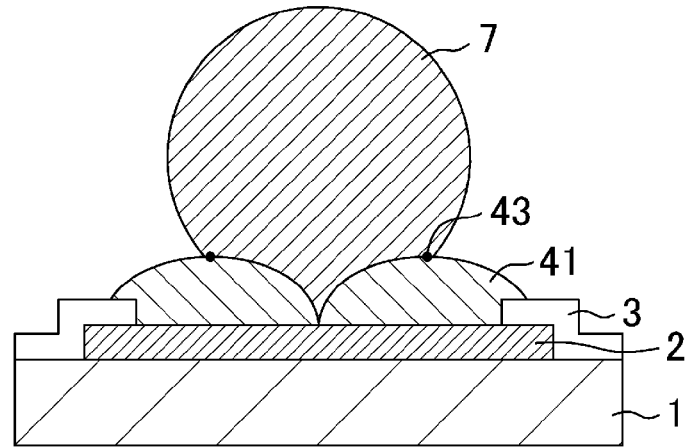

According to the semiconductor device, and the method of manufacturing the semiconductor device in this embodiment, the grooves 42 are radially formed from the center of the metal film 41 toward the periphery of the metal film 41, and therefore, the solder ball 6 is guided by the grooves 42 in the reflow process, and is centered so that the solder ball 6 can be reliably positioned at the center of the metal film 41. In addition, when part of the metal film partitioned by adjoining two of the grooves may be curved in the thickness direction thereof, it becomes possible to distribute stress, which has been applied from the above of the bump 7, over several parts by ball holding portions 43 in packaging steps as shown in FIGS. 4A and 4B. In other words, in the conventional art, even if the solder ball is mounted on the center of the metal film, stress applied through the bump is applied to one point of the center of the metal film in the packaging steps, and as a result, the metal film, the electrode pad, and the semiconductor substrate may be damaged. However, with the structure, the stress from the above is dispersed over the center of the metal film, and besides, over the ball holding portions 43 located at several positions. When the grooves 42 in the metal film 41 are formed so that the groove 42 is narrower at the periphery of the metal film 41 than at the center of the metal film 41, more excellent guiding effect can be obtained. That is because, in general, when a ball moves along a groove, the ball tends to move from part of the groove having a narrower width to part of the groove having a wider width.

Second Embodiment

Figure 5A:
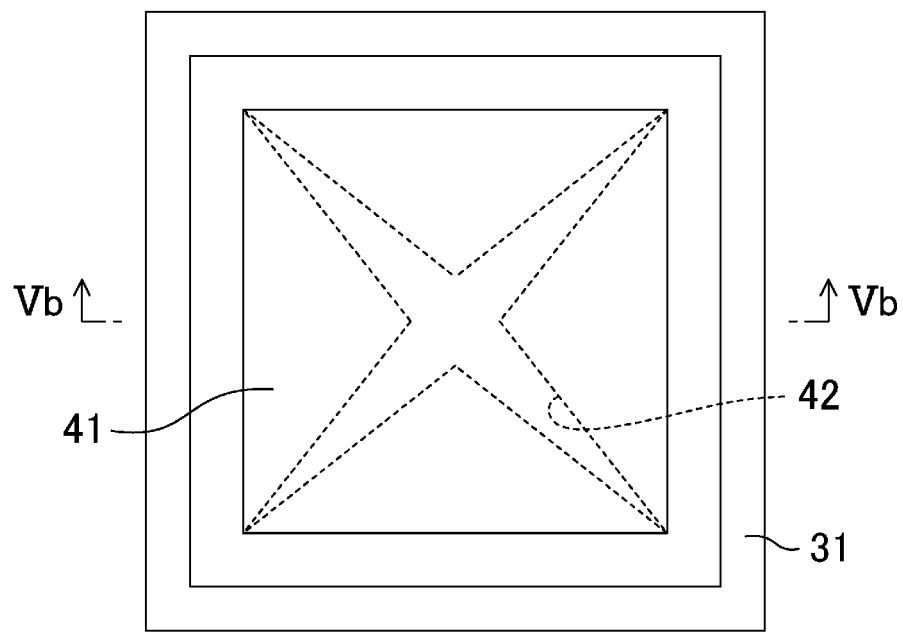
FIGS. 5A-5B are a plan view and a cross-sectional view showing a semiconductor device in a second embodiment of the present invention, respectively.
Figure 5B:
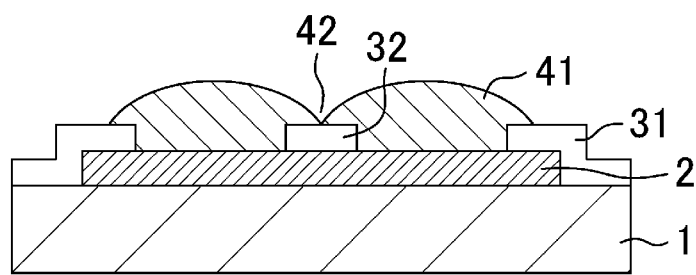
Figure 6A:
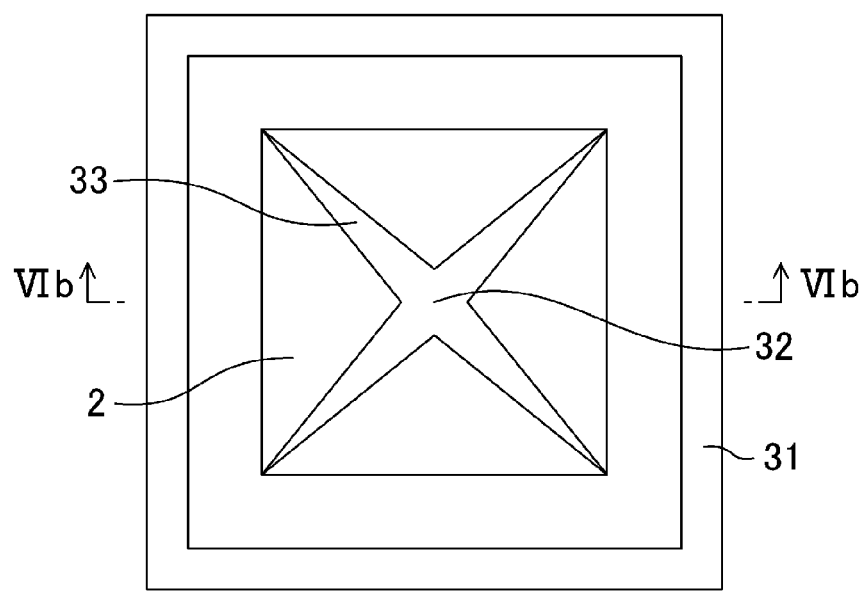
FIGS. 6A-6B are a plan view and a cross-sectional view showing the semiconductor device in the second embodiment of the present invention, respectively.
Figure 6B:
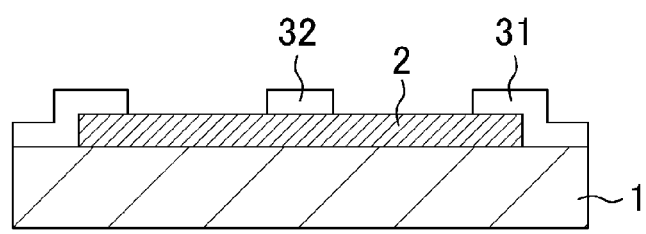

FIGS. 5A-5B and FIG. 6A-6B show a semiconductor device in this embodiment. FIG. 5A shows a plan view of a metal film, and FIG. 5B shows a cross-sectional view taken along cross sectional line Vb in FIG. 5A. FIG. 6A shows a plan view of a second protective film, and FIG. 6B shows a cross-sectional view taken along cross sectional line VIb in FIG. 6A.

As shown in FIGS. 5A-6B, the semiconductor device in this embodiment includes a first protective film which is similar to the protective film in the first embodiment, and further includes the second protective film on an electrode pad exposed through an opening of the first protective film. The semiconductor device has a structure in which an electrode pad 2 is formed on a semiconductor substrate 1 in which a semiconductor circuit is formed, the upper surface of the semiconductor substrate 1 is covered by the first protective film 31, and the opening is provided by an etching process so that the electrode pad 2 is exposed through the opening. The opening may has a circular shape or a polygonal shape other than a rectangular shape. On the electrode pad 2 exposed through the opening, a second protective film 32 having a plurality of branches 33 radially formed from the center of the electrode pad 2 toward a periphery of the electrode pad 2 is formed. The branches 33 of the second protective film 32 may have a shape so that the branch 33 of the second protective film is narrower at the periphery of the opening of the electrode pad 2 than at the center of the opening of the electrode pad 2. The first protective film 31 and the second protective film 32 may be connected to each other at the end of the opening. A metal film 41 is formed as a barrier metal on the electrode pad 2. The metal film 41 includes a plurality of grooves 42 radially arranged from the center thereof toward a periphery thereof, and the grooves 42 are formed along shapes of the branches 33 of the second protective film 32. Part of the metal film partitioned by adjoining two of the grooves is generally curved in the thickness direction thereof.

Figure 7A:
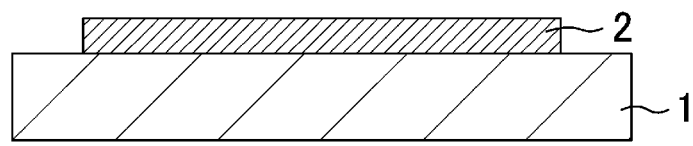
FIGS. 7A-7E are views showing a method of manufacturing the semiconductor device in the second embodiment of the present invention.
Figure 7B:
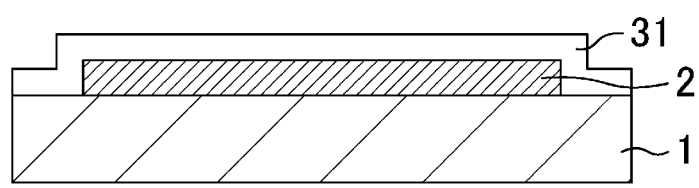
Figure 7C:
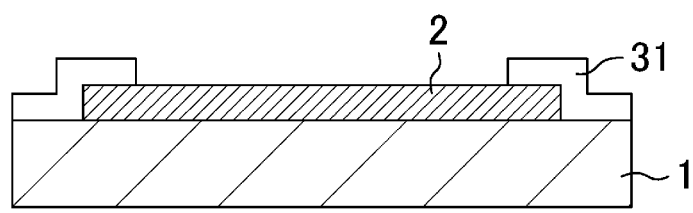
Figure 7D:
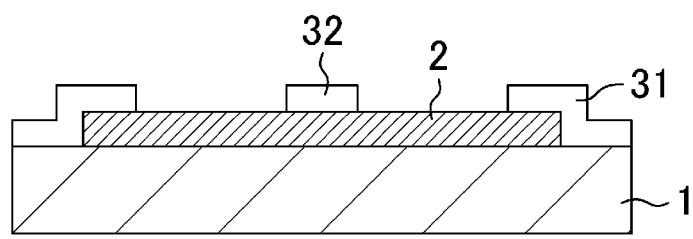
Figure 7E:
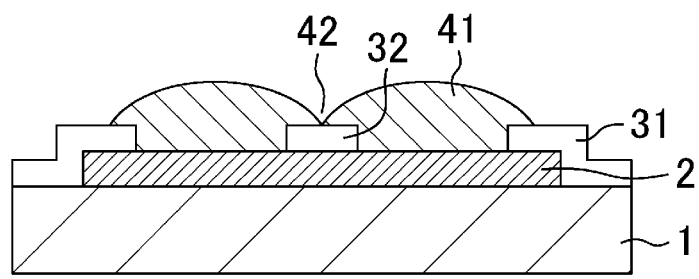
Figure 8A:
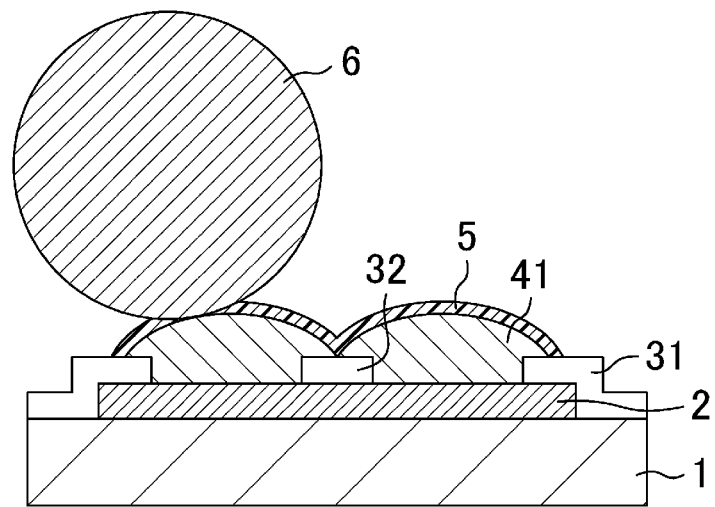
FIGS. 8A-8B are views showing the method of manufacturing the semiconductor device in the second embodiment of the present invention.
Figure 8B:
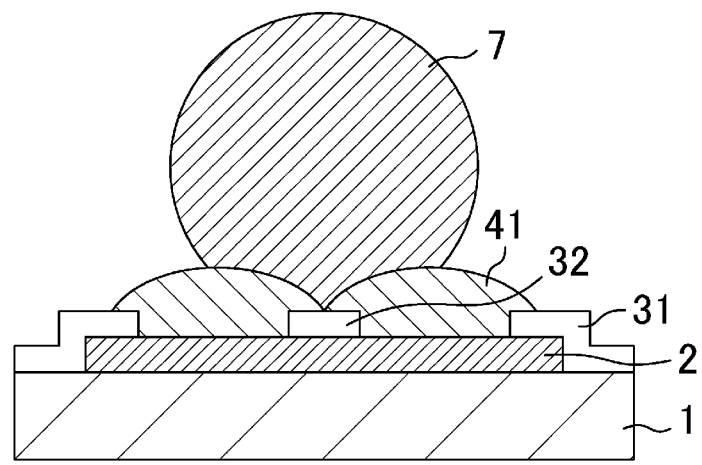

FIGS. 7A-7E and FIGS. 8A-8B are views showing a method of manufacturing the semiconductor device in this embodiment. FIG. 7A is a view showing a semiconductor substrate having the electrode pad, FIG. 7B is a view showing a step of forming the first protective film on the upper surface of the semiconductor substrate, FIG. 7C is a view showing a step of forming the opening on the electrode pad, FIG. 7D is a view showing a step of forming the second protective film, FIG. 7E is a view showing a step of forming the metal film having the plurality of the grooves, FIGS. 8A and 8B are views showing a step of forming a bump.

The steps shown in FIGS. 7A to 7C in the second embodiment are similar to the steps shown in FIGS. 2A to 2C in the first embodiment. Compared to the first embodiment, the second embodiment has a feature of having a step of forming the second protective film, thereby making it possible to directly form the metal film having the plurality of the grooves by an electroless plating method.

First, the step of forming the second protective film in this embodiment will be described.

As shown in FIG. 7D, on the electrode pad 2 exposed through the opening, the second protective film 32 having the plurality of branches 33 radially formed from the center of the electrode pad 2 toward the periphery of the electrode pad 2 is formed. This step may be performed in the same step as the step of forming the opening on the electrode pad. In other words, when the opening is provided on the electrode pad 2, the protective film 31 is etched so that the shape of the second protective film 32 is left, thereby making it possible to directly form the second protective film 32 as shown in FIG. 7D without temporarily being in the state shown in FIG. 7C.

Next, the step of forming the metal film having a plurality of the grooves in this embodiment will be described.

As shown in FIG. 7E, the metal film 41 is formed as a barrier metal on the electrode pad 2. The metal film 41 is generally made of Ni and/or Au. The metal film 41 is formed to have a thickness equal to or larger than the thickness of the first protective film 31. For example, if the thickness of the first protective film 31 is about 1 µm, the thickness of the metal film 41 is about 3 to 4 µm.

When the metal film 41 is formed by using an electroless plating method, a metal film is gradually formed on the exposed electrode pad 2 on which the first protective film 31 and the second protective film 32 are not formed due to the characteristics of the electroless plating method. Finally, the metal film 41 having the grooves 42 having the shapes formed along the branches 33 of the second protective film 32 is formed. The part of the metal film 41 partitioned by adjoining two of the grooves is formed to be curved in the thickness direction thereof. When the branches 33 of the second protective film 32 are formed so that the branch 33 of the second protective film is narrower at the periphery of the opening of the electrode pad 2 than at the center of the opening of the electrode pad 2, the grooves 42 of the metal film 41 have a shape so that the groove 42 of the metal film is formed to be narrower at the periphery of the metal film 41 than at the center of the metal film 41. In other words, according to this embodiment, it is possible to omit a step of forming the grooves 42 of the metal film 41 after the formation of the metal film 41, a step of forming the part of the metal film 41 partitioned by adjoining two of the grooves so that the part of the metal film 41 is curved in the thickness direction thereof, and etc. In the first embodiment, the grooves are formed by grinding by a grinding machine or pressing by a pressing tool, and in the either method, stress is applied in a direction from the upper surface of the semiconductor substrate toward the lower surface of the semiconductor substrate, and the electrode pad and a main body of the semiconductor substrate disposed below the metal film may be damaged. However, in this embodiment, the grooves of the metal film are formed at the time of the formation of the metal film by the electroless plating method, and therefore, there is no need to consider the above circumstance.

Then, the step of forming the bump 7 shown in FIGS. 8A and 8B is similar to that in the first embodiment.

Next, other examples of the semiconductor device in this embodiment will be described with reference to the drawings. FIGS. 9A-9D are plan views of other second protective films in this embodiment.

Figure 9A:
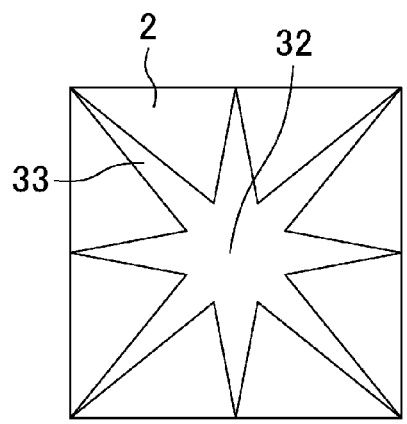
FIGS. 9A-9D are views showing other examples of a second protective film in the semiconductor device in the second embodiment of the present invention.
Figure 9B:
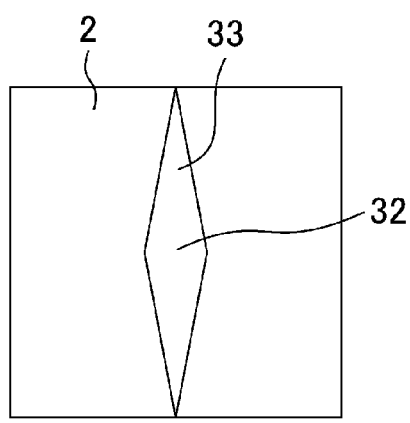
Figure 9C:
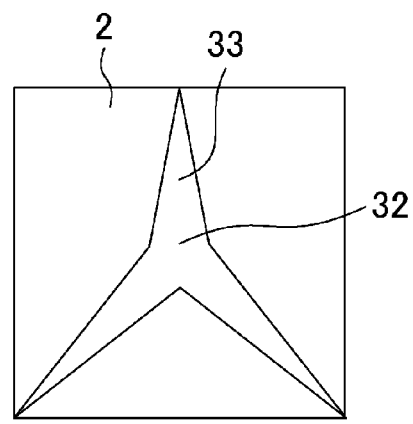

Regarding FIGS. 9A-9C, the second protective film 32 is radially formed from the center of the electrode pad 2 toward the periphery of the electrode pad 2, and is formed so that the branch 33 of the second protective film 32 is narrower at the periphery of the opening of the electrode pad 2 than at the center of the opening of the electrode pad 2. Specifically, the second protective film 32 in FIG. 9A is formed so that the eight branches 33 of the second protective film 32 are left at the maximum. Therefore, eight grooves 42 of the metal film corresponding to the eight branches 33 can be formed, and even when the solder ball 6 is formed to be displaced from the center of the metal film 41 in various directions, there is an advantage that the solder ball 6 is reliably centered so as to be positioned at the center of the metal film 41 by the induction of the eight grooves 42 of the metal film during a reflow process. However, the second protective film 32 is formed so as to have a large area on the electrode pad 2, and a problem of electrical connection may occur. Therefore, the use of the structure shown in FIG. 9A is appropriate when the electrode pad is larger than the solder ball. The second protective film 32 in FIG. 9B is formed so that two branches 33 of the second protective film 32 are left, and the second protective film 32 in FIG. 9C is formed so that three branches 33 of the second protective film 32 are left. As well as FIG. 9A, in FIGS. 9B and 9C, the grooves 42 of the metal film are formed to correspond to the branches 33 of the second protective film 32, and therefore, even when the solder ball 6 is formed to be displaced from the center of the metal film 41 in various directions, there is an advantage that the solder ball 6 is reliably centered so as to be positioned at the center of the metal film 41 by the induction of the grooves 42 of the metal film during a reflow process. However, the second protective film 32 in FIGS. 9B and 9C includes a smaller number of the grooves 42, and therefore, the use of these structures is appropriate when the electrode pad is smaller than the solder ball.

Figure 9D:
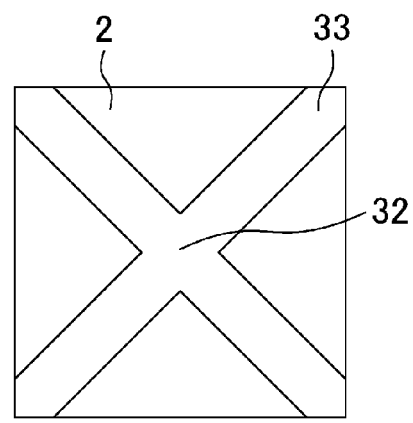
Figure 11A:
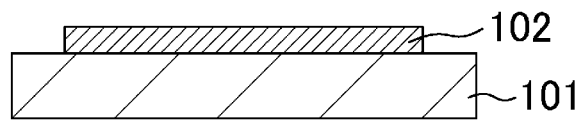
FIGS. 11A-11E are views showing a method of manufacturing the conventional semiconductor device.
Figure 11B:
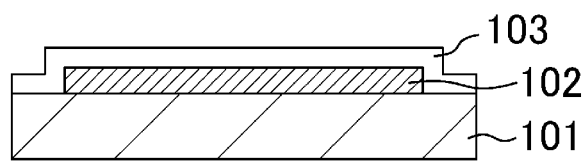
Figure 11C:
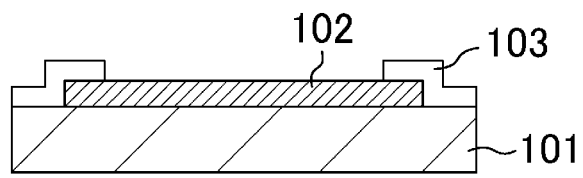
Figure 11D:
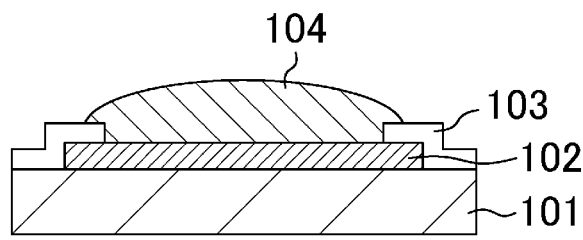
Figure 11E:
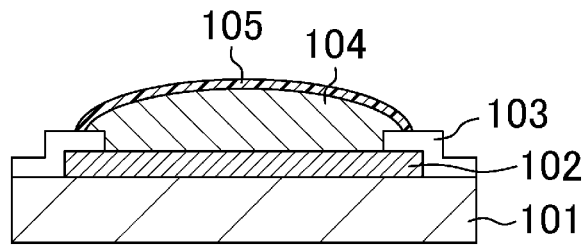
Figure 12A:
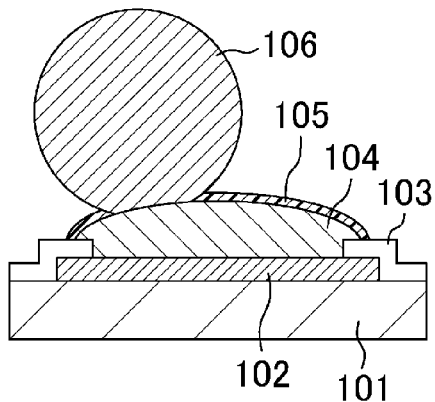
FIGS. 12A-12D are views showing the method of manufacturing the conventional semiconductor device.
Figure 12C:
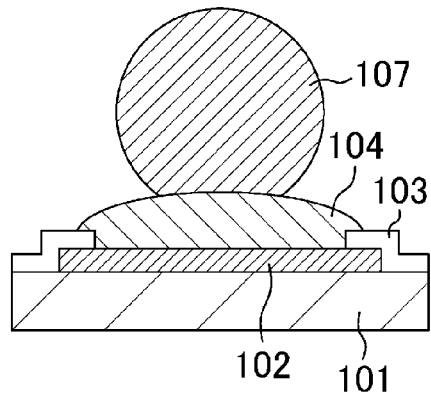
Figure 12B:
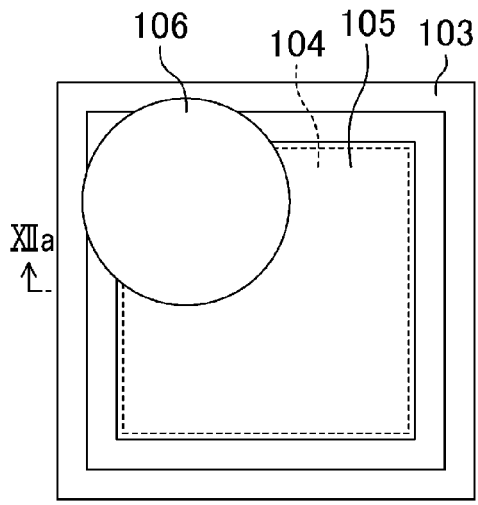
Figure 12D:
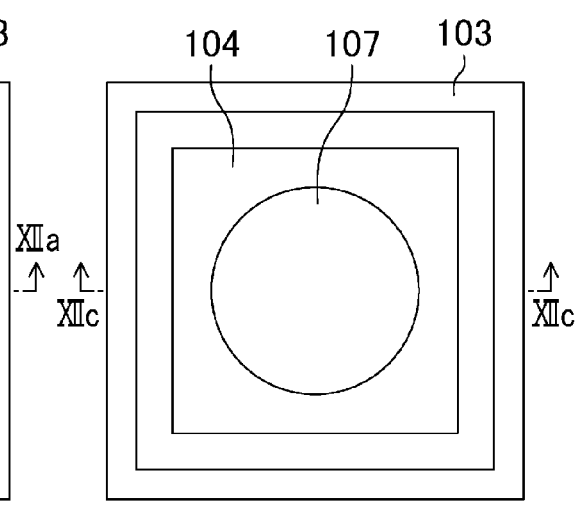
Figure 13A:
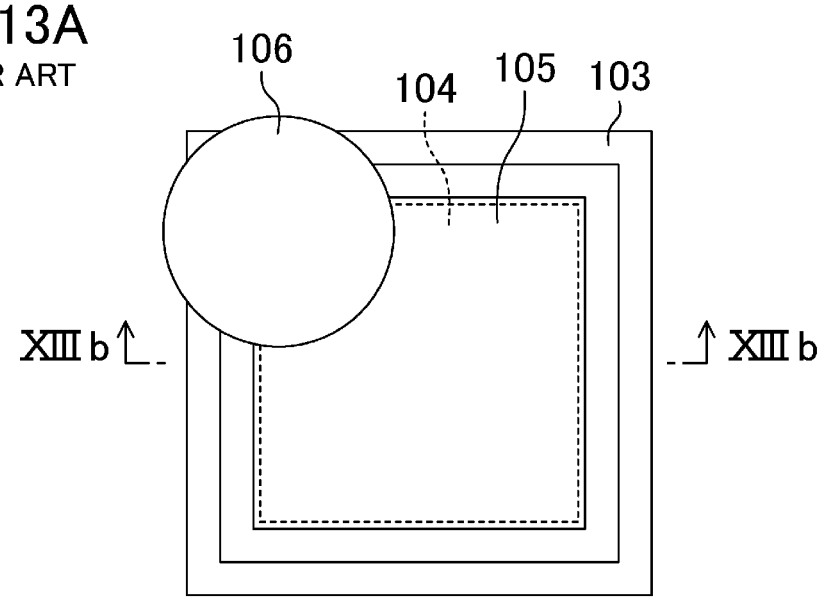
FIGS. 13A-13B are a plan view and a cross-sectional view showing the conventional semiconductor device, respectively.
Figure 13B:
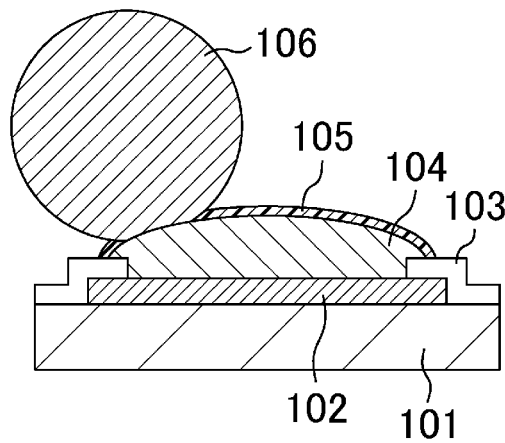

FIG. 9D shows a feature of keeping the width of the branch 32 of the second protective film 32 constant from the center of the opening of the electrode pad 2 to the periphery of the opening of the electrode pad 2.

The present invention relates to semiconductor devices in which bumps are formed on electrode portions by ball mounting methods, and which has a semiconductor substrate, and methods of manufacturing the same, and the present invention is useful for improving connection reliability.

What is claimed is:

1. A semiconductor device, comprising:
a semiconductor substrate having a plurality of electrode pads;
a protective film covering an upper surface of the semiconductor substrate, and having an opening so that each of the electrode pads is exposed therethrough;
a metal film formed on each of the electrode pads exposed through the opening; and
a bump formed on the metal film,
wherein
the metal film includes a plurality of grooves radially formed from a center thereof toward a periphery thereof.

2. The semiconductor device of claim 1, wherein
each of the grooves of the metal film is formed to be narrower at the periphery of the metal film than at the center of the metal film.

3. A semiconductor device, comprising:
a semiconductor substrate having a plurality of electrode pads;
a first protective film covering an upper surface of the semiconductor substrate, and having an opening so that each of the electrode pads is exposed therethrough;
a second protective film formed on each of the electrode pads exposed through the opening;
a metal film formed on the opening; and
a bump formed on the metal film,
wherein
the second protective film includes a plurality of branches radially formed from a center of each of the electrode pads toward a periphery of each of the electrode pads,
the metal film includes a plurality of grooves radially formed from a center thereof toward a periphery thereof, and
the grooves of the metal film are formed along shapes of the branches of the second protective film.

4. The semiconductor device of claim 3, wherein
each of the branches of the second protective film is narrower at a periphery of the opening of each of the electrode pads than at a center of the opening of each of the electrode pads.

5. The semiconductor device of claim 3, wherein
the first protective film and the second protective film are connected to each other at an end of the opening.

6. The semiconductor device of claim 1, wherein
part of the metal film partitioned by adjoining two of the grooves is curved in the thickness direction thereof.

7. The semiconductor device of claim 3, wherein
part of the metal film partitioned by adjoining two of the grooves is curved in the thickness direction thereof.

8. A semiconductor substrate on which a plurality of electrode pads, a protective film having an opening so that each of the electrode pads is exposed therethrough, and a metal film formed on each of the electrode pads exposed through the opening are formed,
wherein
the metal film includes a plurality of grooves radially formed from a center thereof toward a periphery thereof.

9. A method of manufacturing a semiconductor device including a semiconductor substrate having a plurality of electrode pads, the method comprising:
forming a protective film to cover an upper surface of the semiconductor substrate;
forming an opening so that each of the electrode pads is exposed therethrough;
forming a metal film on each of the electrode pads exposed through the opening;
radially forming grooves from a center of the metal film toward a periphery of the metal film; and
forming a bump on the metal film.

10. The method of claim 9, wherein
each of the grooves of the metal film is formed to be narrower at the periphery of the metal film than at the center of the metal film.

11. The method of claim 9, wherein
the metal film is formed by an electroless plating method.

12. A method of manufacturing a semiconductor device including a semiconductor substrate having a plurality of electrode pads, the method comprising:
forming a first protective film to cover an upper surface of the semiconductor substrate;
forming an opening so that each of the electrode pads is exposed therethrough;
forming, in the opening, a second protective film having a plurality of branches radially formed from a center of each of the electrode pads toward a periphery of each of the electrode pads;
forming a metal film on each of the electrode pads exposed through the opening by an electroless plating method, the metal film including a plurality of grooves radially extending from a center of the metal film toward a periphery of the metal film along shapes of the branches of the second protective film; and
forming a bump on the metal film.

13. The method of claim 12, wherein
each of the branches of the second protective film is narrower at a periphery of the opening of each of the electrode pads than at a center of the opening of each of the electrode pads.
14. The method of claim 12, wherein
the first protective film and the second protective film are connected to each other at an end of the opening.
15. The method of claim 12, wherein
the first protective film and the second protective film are formed in a same process step.
16. The method of claim 9, wherein
part of the metal film partitioned by adjoining two of the grooves is curved in the thickness direction thereof.
17. The method of claim 12, wherein
part of the metal film partitioned by adjoining two of the grooves is curved in the thickness direction thereof.

\* \* \* \* \*